United States Patent
Koo

(10) Patent No.: US 9,530,981 B2
(45) Date of Patent: Dec. 27, 2016

(54) SEALING METHOD FOR FLAT PANEL DISPLAY DEVICE

(71) Applicant: Samsung Display Co., Ltd., Yongin, Gyeonggi-Do (KR)

(72) Inventor: Min-Sang Koo, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 416 days.

(21) Appl. No.: 13/949,391

(22) Filed: Jul. 24, 2013

(65) Prior Publication Data
US 2014/0210991 A1    Jul. 31, 2014

(30) Foreign Application Priority Data
Jan. 31, 2013    (KR) .................... 10-2013-0011501

(51) Int. Cl.
*H01J 9/26*    (2006.01)
*H01J 1/62*    (2006.01)
*H01L 51/52*    (2006.01)

(52) U.S. Cl.
CPC ........................... *H01L 51/5246* (2013.01)

(58) Field of Classification Search
CPC ......... H01L 51/5246; H01J 9/32; H01J 63/02; H04N 5/62
USPC ............... 445/25; 313/512; 348/239; 315/51
See application file for complete search history.

(56) References Cited

U.S. PATENT DOCUMENTS

| 6,300,716 | B1* | 10/2001 | Honda | H01J 61/366 |
| | | | | 313/113 |
| 2006/0084348 | A1* | 4/2006 | Becken | C03C 27/06 |
| | | | | 445/25 |
| 2007/0195634 | A1* | 8/2007 | Lee | B23K 26/0604 |
| | | | | 365/230.05 |
| 2008/0002040 | A1* | 1/2008 | Tomura | 348/239 |
| 2012/0127095 | A1* | 5/2012 | Jun | G06F 3/044 |
| | | | | 345/173 |

FOREIGN PATENT DOCUMENTS

| KR | 10-2007-0078501 | 8/2007 |
| KR | 10-2008-0065745 | 7/2008 |
| KR | 10-2012-0080794 | 7/2012 |

\* cited by examiner

*Primary Examiner* — Geepy Pe
*Assistant Examiner* — Syed Hasan
(74) *Attorney, Agent, or Firm* — Robert E. Bushnell, Esq.

(57) ABSTRACT

A method of sealing a flat panel display device by using laser and a charge-coupled device (CCD) camera. The sealing method includes applying a sealant around a light-emitting unit on a substrate and covering above the light-emitting unit with the encapsulating substrate; irradiating light onto a sealant area to harden the sealant for the first time (first hardening); monitoring a hardening state of the sealant; and further irradiating light onto a region of the sealant in a bad hardening state based on the monitoring result to harden the region of the sealant in the bad hardening state (second hardening). The sealing method may prevent a sealing flaw caused from insufficient laser irradiation dosage, and thus ensure a more stable sealed structure. This may improve quality of the flat-plan-display-device.

14 Claims, 5 Drawing Sheets

SEALING METHOD FOR FLAT PANEL DISPLAY DEVICE

This application makes reference to, incorporates the same herein, and claims all benefits accruing under 35 U.S.C. §119 from an application earlier filed in the Korean Intellectual Property Office on 31 Jan. 2013 and there duly assigned Serial No. 10-2013-0011501.

BACKGROUND OF THE INVENTION

1. Field of the Invention

The present disclosure relates to a method of sealing a display area of a flat panel display device.

2. Description of the Related Art

A flat panel display device, such as an organic light emitting display device, may be made very thin and flexible due to its operational features. For this reason, there has been plenty of ongoing research into the device.

However, a light-emitting unit of the organic light emitting display device is deteriorated by the permeation of water into the area. Therefore, the organic light-emitting device needs an encapsulating structure sealing and protecting the light-emitting unit from the permeation of external water.

The above information disclosed in this Related Art section is only for enhancement of understanding of the background of the invention and therefore it may contain information that does not form the prior art that is already known to a person of ordinary skill in the art.

SUMMARY OF THE INVENTION

One or more embodiments of the present disclosure include disclosure of a method of sealing a flat panel display device to prevent a sealing flaw caused by insufficient laser dosage.

Additional aspects will be set forth in part in the description which follows and, in part, will be apparent from the description, or may be learned by practice of the presented embodiments.

According to one or more embodiments of the present disclosure, a method of sealing a flat panel display device may include applying a sealant around a light-emitting unit on a substrate and covering above the light-emitting unit with the encapsulating substrate; irradiating light onto a sealant area to harden the sealant for the first time (first hardening); monitoring a hardening state of the sealant; and further irradiating light onto a region of the sealant in a bad hardening state based on the monitoring result to harden the region of the sealant in the bad hardening state (second hardening).

The monitoring of the hardening state of the sealant may include real-time monitoring of the sealant area through a charge-coupled device (CCD) camera.

The CCD camera may monitor the hardening state of the sealant while moving together with a light irradiating head.

The monitoring may further include installing a neutral density (ND) filter in the CCD camera.

The sealant may include a frit.

The light may include a laser light.

The method of sealing the flat panel display device may further include mounting onto the encapsulating substrate a sealant hardening mask with a light transmitting slit which may be in a shape corresponding to a shape of the sealant area, and light is irradiated onto the sealant area through the light transmitting slit. A light irradiated for the second hardening may be about 70-80% strong compared to the light power irradiated for the first hardening.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
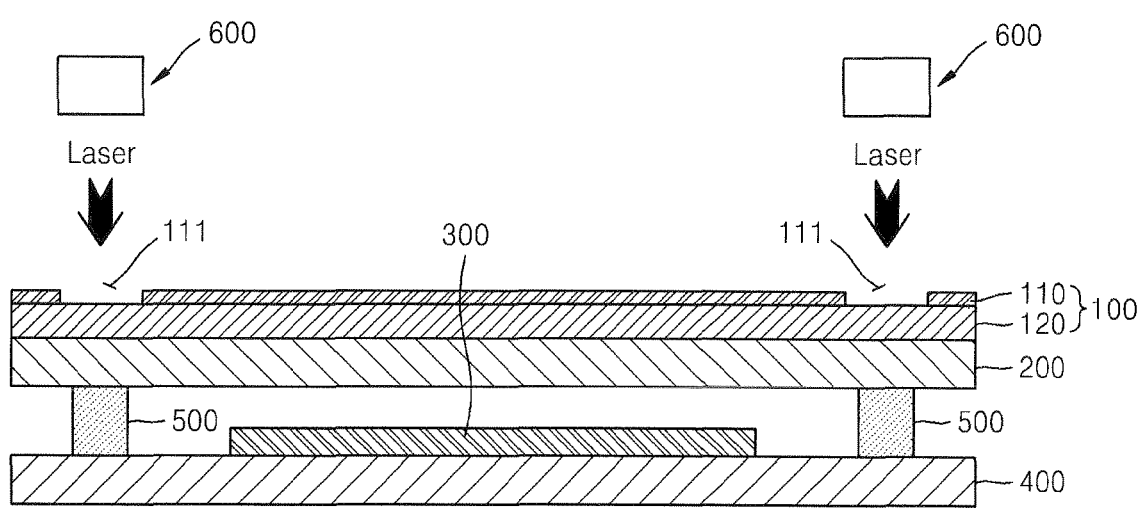
FIG. 1 is a sectional view illustrating a method of sealing a flat panel display device, according to an embodiment of the present disclosure.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A conventional encapsulating structure includes a glass substrate with a light-emitting unit thereon, and an encapsulating substrate covering the glass substrate, the space between the glass substrate and the encapsulating substrate being sealed with a sealant such as frit. To put it another way, the frit is applied around the light-emitting unit, then the encapsulating substrate is placed on top of the frit, and laser is irradiated to harden the frit, thereby finishing the sealing.

When hardening the frit sealant around the light-emitting unit by irradiating laser onto the sealant, if the irradiated laser's energy amount is overly irregular in different irradiated parts, the sealing may be done with flaws. In other words, if the laser energy amount is insufficient, the sealant does not harden well enough to make a perfect sealing, and the sealed parts may be separated from each other. In particular, sealing flaws often occur around areas where the laser irradiation starts and ends. Since the sealing laser power gradually rises and falls as the laser power is turned on and off, the areas where laser irradiation starts or ends lacks laser energy amount compared to other areas, and thus may not be perfectly sealed.

Products with such sealing flaws cannot be used. Therefore, there are needs for a solution for such sealing problem.

Figure 2:
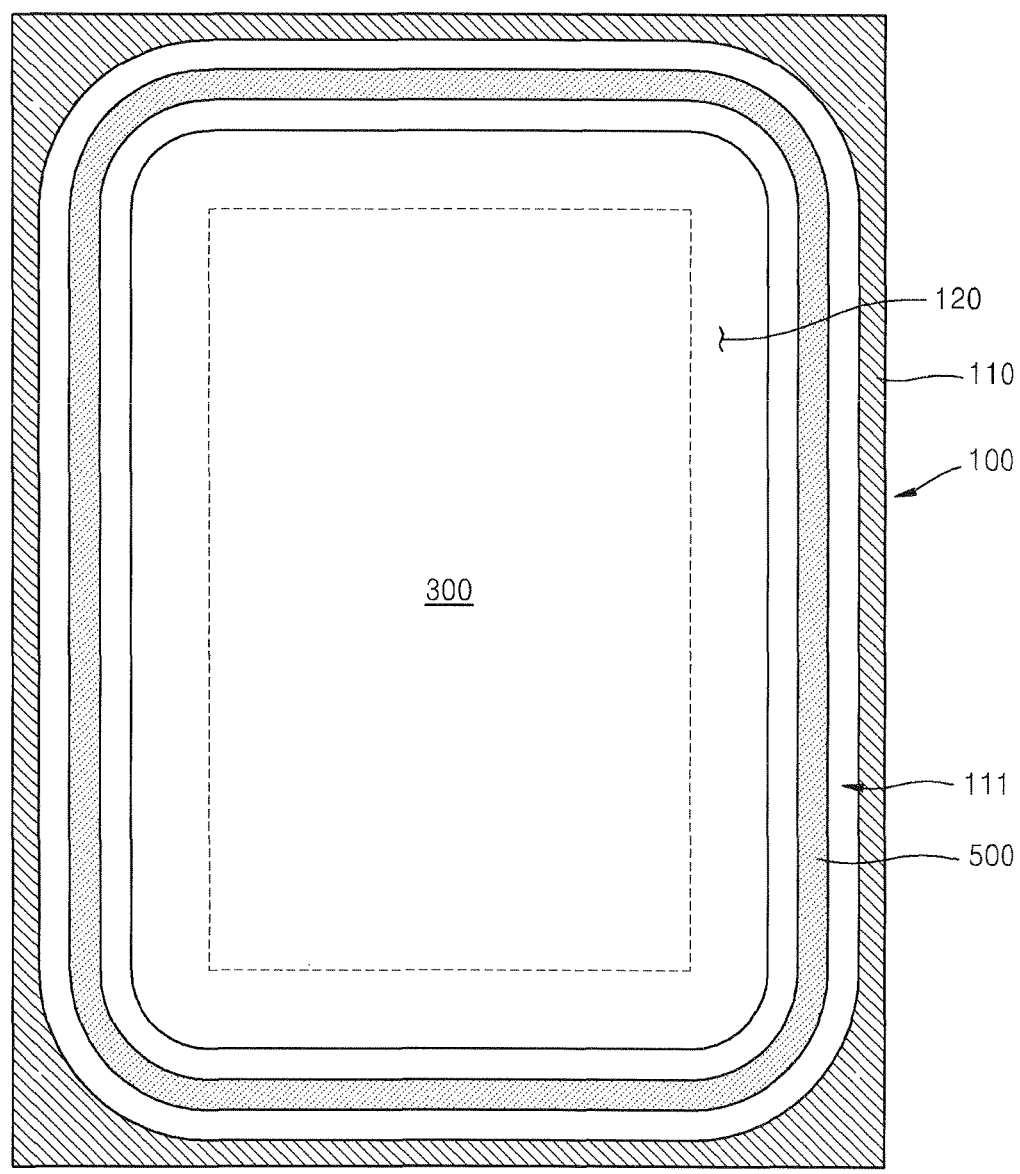
FIG. 2 is a plan view of the flat panel display device of FIG. 1.

FIGS. 1 and 2 illustrate a method of sealing a flat panel display device, according to an embodiment of the present disclosure.

As illustrated in FIGS. 1 and 2, the flat panel display device includes a substrate 400, a light emitting unit 300 disposed on the substrate 400, an encapsulating substrate 200 covering the light-emitting unit 300, and a sealant 500 applied around the light-emitting unit 300 to seal a space between the substrate 400 and the encapsulating substrate 200, and the like.

The sealant 500 may be a frit. The frit as a source material for glass has a characteristic of hardening when exposed to a laser. Therefore, when a frit as the sealant 500 is applied on the substrate 400, covered with the encapsulating substrate 200, and finally irradiated by laser, the frit may harden and seal the space between the substrate 400 and the encapsulating substrate 200.

Figure 3:
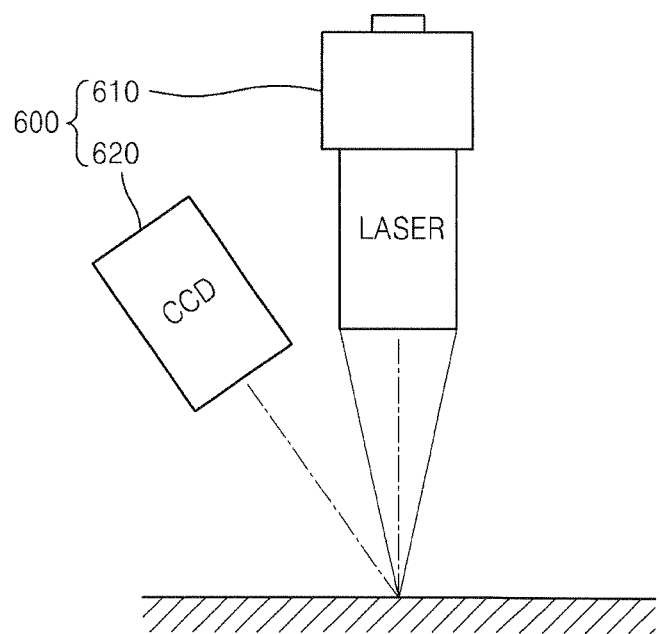
FIG. 3 is a front view illustrating a detailed structure of a laser device of FIG. 1.

Reference number 100 represents a sealant hardening mask that guides laser to be properly irradiated on the sealant 500 to harden the sealant 500. The sealant hardening mask 100 may include a transparent base 120 and a light shielding pattern 110 defining a light transmitting slit 111 on top of the substrate 120. Thus, laser from a laser device 600 (see FIG. 3) may be irradiated on the sealant 500 through the light transmitting slit 111. Of course, the light transmitting slit 111 may be formed in a shape corresponding to a shape of the area where the sealant 500 is applied, as illustrated in FIG. 2.

Referring to FIG. 4, the laser device 600 includes a laser irradiator 610 which irradiates laser to the sealant 500, and a charge-coupled device (CCD) camera 620 that monitors a hardening state of the sealant 500. The laser irradiator 610 may irradiate laser to harden the sealant 500 while moving along the light transmitting slit 111. The CCD camera 620 may provide video information to a user while moving along with the laser irradiator 610 to allow the user to monitor if the sealant 500 is hardening well.

Figure 4A:
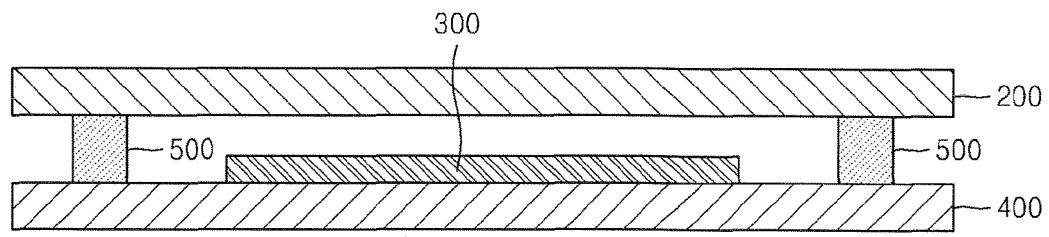
FIGS. 4A to 4C are sectional views illustrating the sealing method of FIG. 1 step by step.
Figure 4B:
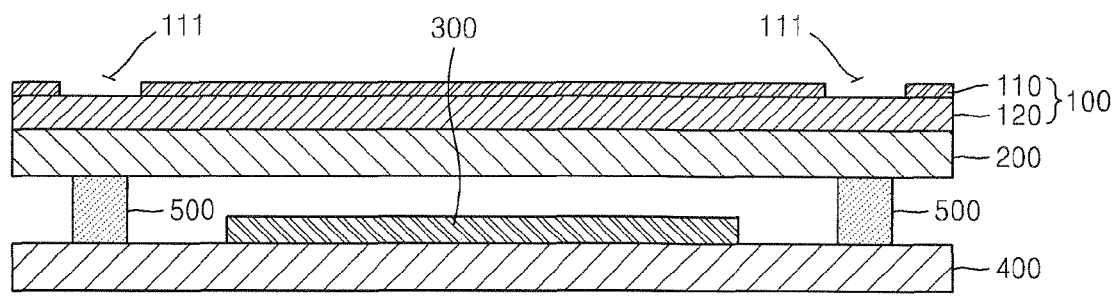
Figure 4C:
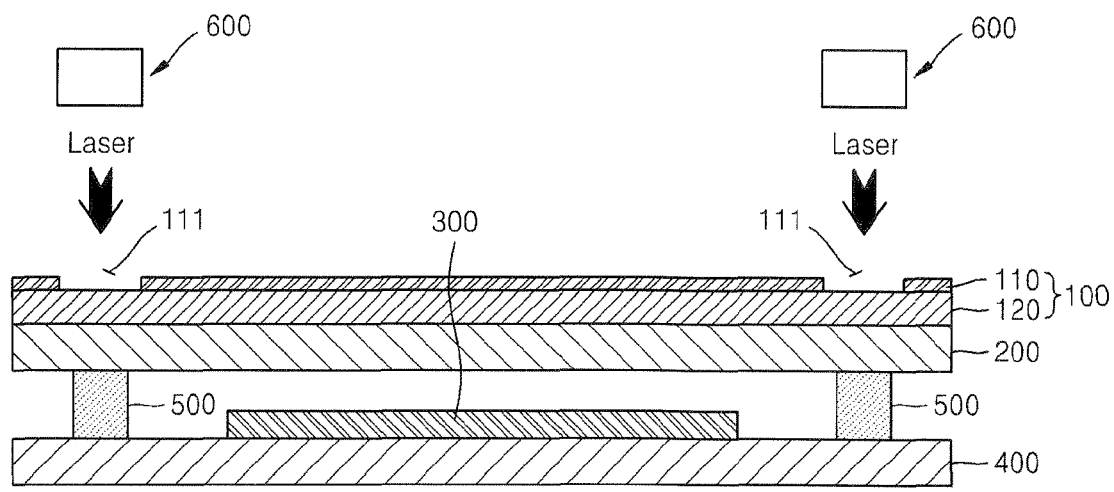
Figure 5:
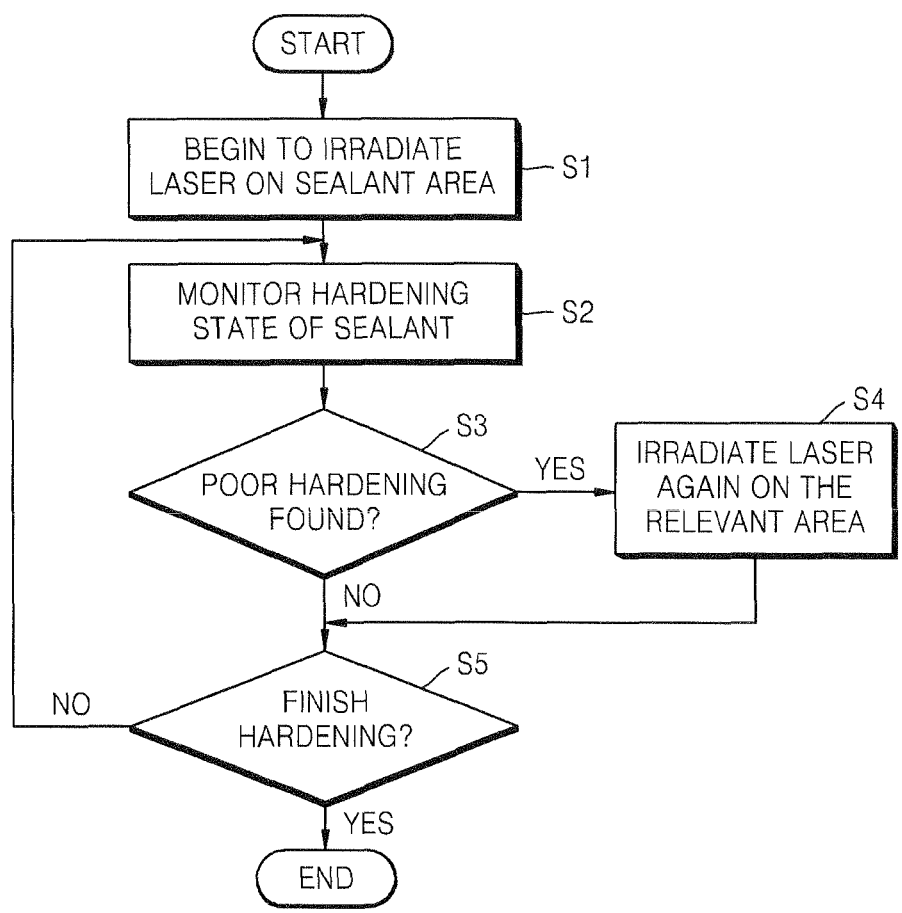
FIG. 5 is a flow chart of the sealing method of FIG. 1.

Sealing a flat panel display device by using such a laser device 600 may be performed as illustrated in FIGS. 4A to 5. FIGS. 4A to 4C are sectional views illustrating the sealing method step by step. FIG. 5 is a flowchart of the sealing method.

First of all, as illustrated in FIG. 4A, the light-emitting unit 300 may be formed on a surface of the substrate 400, and the sealant 500 may be applied around the light-emitting unit 300. Then the encapsulating substrate 200 may be disposed to cover the sealant 500.

Next, as illustrated in FIG. 4B, the sealant hardening mask 100 may be mounted on top of the encapsulating substrate 200. At this time, the sealant hardening mask 100 may be disposed to match the light transmitting slit 111 with the area where the sealant 500 may be applied.

Having the parts ready as illustrated above, the laser device 600 may irradiates laser to harden the sealant 500, as illustrated in FIG. 4C.

Referring to FIG. 5, once the laser irradiator 610 of the laser device 600 begins to irradiate laser on the sealant 500 while moves along the light transmitting slit 111 (Operation S1), the CCD camera 620 located next to the laser irradiator 610 images the hardening state of the laser-irradiated sealant 500 while moving along the laser irradiator 610, and provides the resulting video information to the user to allow real-time monitoring (Operation S2).

Then, it is determined whether the hardening state of the sealant 500 is good or not (Operation S3). If the hardening state of the sealant 500 is determined to be good, then the process moves onto determining whether to finish the hardening or not (Operation S5).

If the hardening state of the sealant 500 is determined to be bad, the process moves onto re-irradiating laser onto a corresponding region of the sealant 500 (Operation S4).

In other words, if a region of the sealant 500 is found to be in a bad hardening state during the monitoring of the first hardening process (Operation S3), the region of the sealant 100 in the bad hardening state may be irradiated again by laser for the second hardening process (Operation S4). By doing this, the insufficient energy irradiation for the first hardening may be supplemented through the second hardening to completely harden the region in the bad hardening state. The regions of the sealant 50 where the laser irradiation starts and ends are often likely to be sealed improperly. The laser irradiator 610 starts to move along the light transmitting slit 111 upon being turned on, to make a full round of the sealant hardening mask 100 to reach back to the starting spot, and then may be turned off. As described above, the power of the laser gradually rises and falls at the points of time when turned on and off, so that on and off spots may be irradiated by laser in insufficient energy amount, compared to other regions areas of the sealant 500. Therefore, it is appropriate to carefully monitor the on and off spots.

The laser energy dosage for the second hardening process may be about 70-80% of the laser energy dosage for the first hardening process. This may provide an annealing effect of reducing thermal stress, making the sealing more solid.

Therefore, when sealing is processed as mentioned above, since spots in bad hardening state may be repaired through real-time monitoring, a more stable and solid sealed structure may be attained.

The CCD camera 620 may be equipped with a neutral density (ND) filter (not shown). The ND filter may reduce reflected light so that more accurate video information may be obtained.

As described above, according to the one or more of the above embodiments, a method of sealing a flat panel display device may prevent a sealing flaw caused from insufficient laser irradiation dosage, and thus ensure a more stable sealed structure. This may improve quality of the flat-panel-display-device.

While the disclosure has been particularly shown and described with reference to an embodiment illustrated in FIGS thereof, the embodiment is to be interpreted as only an example. Also, it will be understood by those skilled in the art that various changes in form and details may be made therein without departing from the spirit and scope of the disclosure as defined by the following claims.

What is claimed is:

1. A method of sealing a flat panel display device, the method comprising:
applying a sealant around a light-emitting unit on a substrate and covering above the light-emitting unit with the encapsulating substrate;
irradiating light onto a sealant area to harden the sealant for a first time forming a first hardening;
monitoring a hardening state of the sealant; and
further irradiating light onto a region of the sealant in a bad hardening state based on the monitoring result to harden the region of the sealant in a bad hardening state forming a second hardening,
wherein the second light irradiation dosage for the second hardening is about 70-80% of the first light irradiation dosage for the first hardening.

2. The method of claim 1, wherein the monitoring of the hardening state of the sealant comprises real-time monitoring of the sealant area through a charge-coupled device (CCD) camera.

3. The method of claim 2, wherein the CCD camera monitors the hardening state of the sealant while moving together with a light irradiating head.

4. The method of claim 2, wherein the method further comprises installing a neutral density (ND) filter in the CCD camera.

5. The method of claim 1, wherein the sealant comprises a frit.

6. The method of claim 1, wherein the light comprises laser light.

7. The method of claim 1, wherein the method further comprises mounting onto the encapsulating substrate a sealant hardening mask with a light transmitting slit which is in a shape corresponding to a shape of the sealant area, and light is irradiated onto the sealant area through the light transmitting slit.

8. A method of sealing a flat panel display device, the method comprising:
applying a sealant around a light-emitting unit on a substrate and covering above the light-emitting unit with the encapsulating substrate;
irradiating light onto a sealant area to harden the sealant for a first time forming a first hardening using a first light irradiating dosage;
monitoring a hardening state of the sealant; and
further irradiating light onto a region of the sealant in a bad hardening state based on the monitoring result to harden the region of the sealant in a bad hardening state forming a second hardening using a second light irradiating dosage,
wherein the second light irradiation dosage for the second hardening is about 70-80% of the first light irradiation dosage for the first hardening.

9. The method of claim 8, wherein the monitoring of the hardening state of the sealant comprises realtime monitoring of the sealant area through a charge-coupled device (CCD) camera.

10. The method of claim 9, wherein the CCD camera monitors the hardening state of the sealant while moving together with a light irradiating head.

11. The method of claim 10, wherein the method further comprises installing a neutral density (ND) filter in the CCD camera.

12. The method of claim 8, wherein the sealant comprises a frit.

13. The method of claim 8, wherein the light comprises laser light.

14. The method of claim 8, wherein the method further comprises mounting onto the encapsulating substrate a sealant hardening mask with a light transmitting slit which is in a shape corresponding to a shape of the sealant area, and light is irradiated onto the sealant area through the light transmitting slit.

* * * * *